NEUTRALIZATION OF INTERELECTRODE CAPACITANCE
IN TRANSISTOR PULSE CIRCUITS
Filed Sept. 26, 1956

INVENTOR.
J. PRESPER ECKERT, JR.
BY
Charles E. English
AGENT 2,987,627

NEUTRALIZATION OF INTERELECTRODE CAPACITANCE IN TRANSISTOR PULSE CIRCUITS

John Presper Eckert, Jr., Gladwyne, Pa., assignor to Sperry Rand Corporation, New York, N.Y., a corporation of Delaware Filed Sept. 26, 1956, Ser. No. 612,305
15 Claims. (Cl. 307—88.5)

Figure 1:
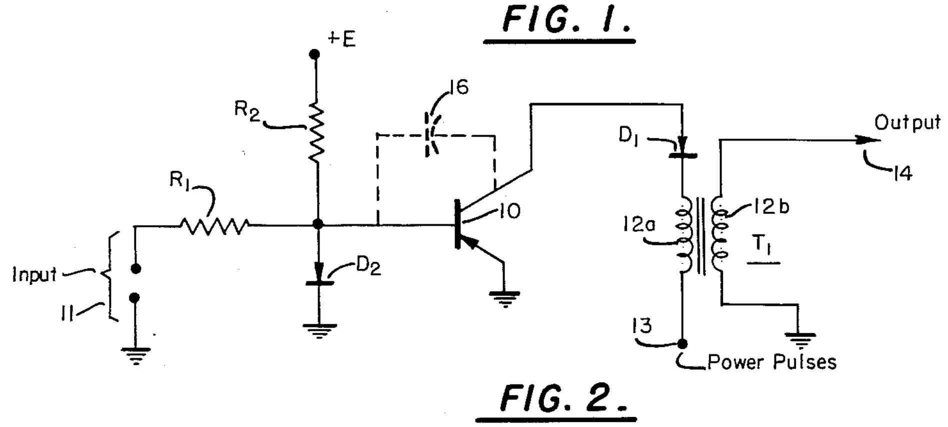

The present invention relates to logical devices or amplifier structures, and is more particularly concerned with such devices and structures comprising pulsed transistors in combination with means inhibiting the coupling of signals via interelectrode capacitances in such transistors whereby the operation of the overall device is considerably improved.

Reference is made to my prior copending application Serial No. 538,318, filed October 4, 1955, for: "Transistor Logical Device," now Patent No. 2,866,105, wherein improved transistor circuits are described. As is discussed in the said prior copending application, such improved transistor circuits may comprise a transistor having an input and an output in combination with a power pulse source for regularly keying a load into the transistor output circuit. The improved devices are further associated with sources of selective input signals, and the overall timing of the arrangement is so selected that an overlap occurs between possible input signals (i.e. input times) and the power pulse keying source (i.e. output times). By reason of this arrangement, therefore, an initial input period is provided wherein a selectively occurring input signal may be caused to charge the transistor; and subsequent operation of the power pulse source acts to effectively couple the load to the transistor so charged, whereby an output pulse of excellent waveform appears across the said load during occurrence of the power pulse.

It will be appreciated from the above that the input source produces selectively occurring signals, and it will further be appreciated that joint operation of the input source and power pulse source is required in determining the output signal state at the circuit load. In practice, it has been found that a portion of the power pulse may tend to be coupled back to the amplifier input when such a power pulse occurs in the absence of an input signal, and this coupling back, which occurs via interelectrode capacitance in the transistor, causes operation of the overall circuit to be something less than optimum. The present invention is therefore primarily concerned with overcoming effects arising by reason of this power pulse feedback to the pulsed transistor input whereby the operation of transistor pulse circuits is substantially improved.

It is accordingly an object of the present invention to provide an improved transistor circuit.

Another object of the present invention resides in the provision of means for inhibiting undesired feedback between the output and input of a transistor circuit.

A further object of the present invention resides in the provision of an improved transistor circuit having a pulsed or keyed output in combination with means for isolating the said pulsed output from the transistor input.

Still another object of the present invention resides in the provision of improved transistor circuits in combination with means for neutralizing interelectrode capacitance, and in particular collector-to-base capacitance in such circuits.

A further object of the present invention resides in the provision of a pulse type transistor circuit which has improved gain and which further avoids possible spurious outputs due to undesired feedback in the circuit.

The foregoing objects, advantages, construction and operation of the present invention will become more readily apparent from the following description and accompanying drawings, in which:

FIGURE 1 is a schematic diagram of a pulse type transistor circuit including an improved feedback neutralizer in accordance with one embodiment of the present invention.

Figures 2, 3, 4:
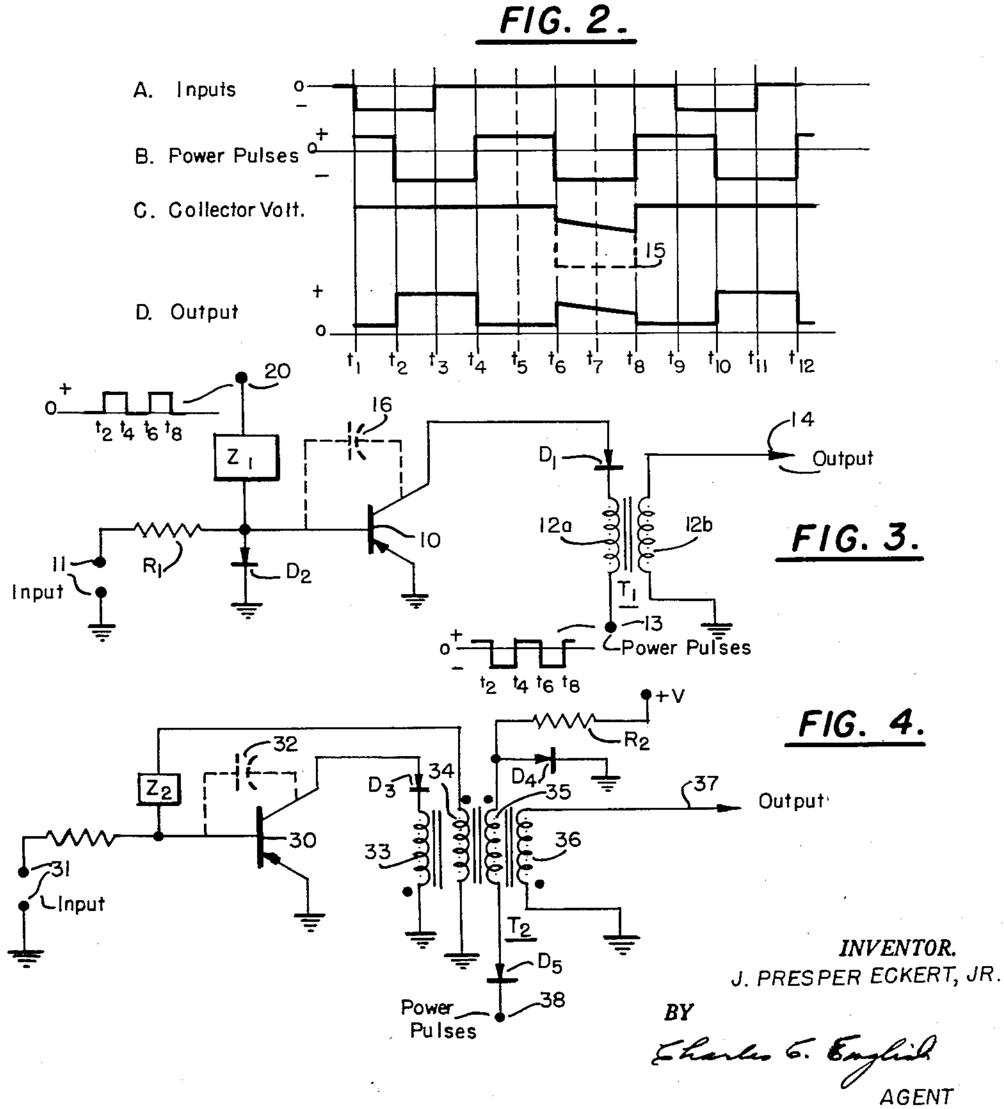

FIGURE 2 (A through D) comprises waveforms illustrating the operation of the circuit shown in FIGURE 1, in the absence of the improvement comprising the present invention.

FIGURE 3 is a schematic diagram illustrating another embodiment of the present invention; and FIGURE 4 is a schematic diagram of a still further embodiment of the present invention.

Referring now to FIGURE 1, it will be seen that, in accordance with the present invention, an improved pulse type circuit may comprise a transistor 10 of the PNP type arranged in a grounded emitter connection. It must be stressed that the particular circuit shown in FIGURE 1, as well as in the other embodiments to be described, is illustrative only and the principles of the present invention may be applied to other forms of transistor pulse circuits including those utilizing NPN type transistors as well as those arranged in grounded base and grounded collector connections. The base of transistor 10 is coupled to an input source 11 having an output resistance R1; and the source 11 is arranged to selectively produce negative-going inputs, for instance of the type illustrated in FIGURE 2A. The collector of transistor 10 is coupled via a rectifier D1 to one end of a winding 12*a* on transformer T1, and the other end of the said winding 12*a* is coupled to a source 13 of regularly spaced positive and negative-going power pulses generally of the configuration illustrated in FIGURE 2B. A further winding 12*b* on transformer T1 is inductively coupled to winding 12*a*, whereby output pulses selectively appear at terminal 14.

The operation of the circuit thus far described in reference to FIGURE 1 will become readily apparent from an examination of the waveforms shown in FIGURE 2. Before proceeding with this description, however, it must be emphasized that the particular rectangular waveforms illustrated in FIGURE 2 are meant to be illustrative only and other waveforms having sinusoidal or irregular shapes, may in fact be employed without departing from the present invention. The circuit shown in FIGURE 1 is so designed that input and output time periods overlap one another; and in particular, input time periods have been illustrated in FIGURE 2 for the time intervals *t*1 to *t*3, *t*5 to *t*7 and *t*9 to *t*11, while output time periods occur in coincidence with negative-going excursions of the power pulse source 13, and comprise the time intervals *t*2 to *t*4, *t*6 to *t*8 and *t*10 to *t*12.

Due to the foregoing input-output time overlap, an initial input period is provided for the charging of transistor 10, and in particular it will be noted that during the time interval *t*1 to *t*2, power pulse source 13 (FIGURE 2B) is positive-going in nature whereby rectifier D1 is non-conductive and output point 14 is effectively isolated from the remainder of the circuit. During this initial time period *t*1 to *t*2, the transistor 10 is therefore charged; and at time *t*2, the power pulse source 13 falls to a negative potential thereby rendering rectifier D1 conductive whereby an output appears at terminal 14. The input from source 11 may disappear, for instance at a time *t*3, but due to well known charge storage effects in the transistor 10, the output will be maintained at point 14 (FIGURE 2D) for a time period subsequent to the cessation of the said input signal, whereby the said output pulse may be taken at terminal 14 during the entire time interval corresponding to the negative-going excursion of power pulse source 13, namely, time interval *t2* to *t4*.

The operation thus far described for the time interval *t1* to *t4* has assumed that input and power pulses are jointly applied to the circuit. However, inasmuch as the input source 11 produces selectively occurring pulses, there may in fact be no input pulse during one of the input time periods, and absence of such an input pulse has been indicated for the input time interval *t5* to *t7*. For this latter state of operation, no output should occur at terminal 14 upon occurrence of a negative-going power pulse, and in fact the collector of transistor 10 should follow the negative-going power pulse excursion, as indicated in dotted lines at 15 in FIGURE 2C.

Although the transistor 10 is supposed to be cut off when a negative-going power pulse, such as that present in the time interval *t6* to *t8*, occurs without a prior occurring input pulse, for instance during the time interval *t5* to *t7*, in actual practice a portion of the pulsed signal at the transistor collector is fed through the interelectrode capacitance 16 from the transistor collector to the transistor base; and this undesired interelectrode feedback tends to turn the transistor partially on. By reason of this undesired operation, therefore, there is an effective amplification of the collector-to-base capacitance by the current gain from the base-to-collector in the transistor whereby an undesired sneak pulse output may appear at terminal 14 even though no input pulse was previously applied to the circuit.

In order to avoid this undesired operation, the present invention contemplates the provision of a constant current source coupled to the transistor input; and for the particular examples comprising the present invention, this constant current source is coupled to the base of the transistor. In accordance with one arrangement, illustrated in FIGURE 1, the said constant current source may comprise a resistor R2 connected at one of its ends to the transistor base, and connected at the other of its ends to a positive voltage +E; and the said input circuit of the transistor 10 is further associated with a rectifier D2 having its anode connected to the transistor base and having its cathode grounded. Current source +E—R2 is arranged to supply a current which is equal to or greater than the current drawn by the collector-to-base capacitance 16 during the collector output pulse times; and in addition, the rectifier D2 serves to limit the positive voltage excursion on the base. In actual practice, the arrangement of components +E—R2 and D2 comprises a potential clamp which maintains the base of transistor 10 at ground potential in the absence of an input signal, and application of a negative-going input signal will in effect disconnect rectifier D2 whereby the base may go negative thereby to produce a desired output from the circuit.

The circuit thus described in reference to FIGURE 1 and comprising a steady state current source coupled to the base of transistor 10, has the disadvantage that the constant current must be supplied by the input signal during input time periods, whereby the overall circuit gain is reduced somewhat. The performance of the circuit may be considerably improved, therefore, by substituting a pulse type current source or a keyed constant current source which is operative to supply current pulses to the transistor base only during time periods corresponding to occurrence of output power pulses. Such a preferred arrangement is illustrated in FIGURE 3, and like components have been designated by like numerals in the said FIGURE 3.

In particular, the constant current source +E—R2 previously described in reference to FIGURE 1, is now replaced by a pulsed voltage source 20 producing regularly spaced positive-going voltage excursions, and the said source 20 is coupled to the base of transistor 10 via impedance Z1 which may comprise a resistor, a capacitor, or other forms of coupling network. It will be appreciated from examination of the waveforms adjacent source 20 and source 13 that the positive-going excursions of source 20 occur in coincidence with negative-going excursions of source 13, and inasmuch as neutralizing current does not flow via impedance Z1 until some time after the start of the input signal, the full input power is available to start or charge the transistor whereby the overall circuit exhibits a substantially improved gain-bandwidth product.

The circuit described in FIGURE 3, while exhibiting improved operation over that described in reference to FIGURE 1, still suffers from the disadvantage that neutralizing current pulses are applied to the transistor base during a portion of each input time period regardless of whether an input signal actually occurs during the said input time period. To effect optimum operation of the device, neutralizing current need in fact be applied only in the absence of an input signal, and therefore best operation is achieved through the provision of circuit means which are responsive to the output state of the transistor device for determining whether or not neutralizing current pulses should be applied to the circuit input.

A preferred form of structure operating in accordance with this latter embodiment, is illustrated in FIGURE 4, and the particular circuit shown in FIGURE 4 actually comprises a complementing transistor amplifier. Thus, a transistor 30 may again be arranged in a grounded emitter connection, and input signals may be supplied by a source 31 to the base of the said transistor 30. As before, the circuit includes interelectrode capacitance 32 between the collector and base of the transistor, and the said collector of the transistor is coupled via a rectifier D3 to one winding 33 on a transformer T2. Transformer T2 includes, in addition, a feedback winding 34, a power winding 35, and an output winding 36 coupled to output terminal 37. Power winding 35 is coupled at its upper end to a clamp circuit comprising voltage source +V, resistor R2, and rectifier D4, and the said power winding 35 is further coupled at its lower end via rectifier D5 to a source 38 of regularly positive and negative-going power pulses, for instance of the type illustrated in FIGURE 2B.

In operation, let us initially assume that no input signal is applied to terminal 31. When the power pulse source 38 goes negative in potential, current is drawn through winding 35 and thence via rectifier D5 to the said source 38, whereby the core of transformer T2 experiences a flux change. This flux change induces a voltage in output winding 36 whereby a pulse may be taken at terminal 37, and the said flux change further induces potentials in windings 34 and 33. The potential thus induced in winding 34 is coupled to the base of transistor 30 via impedance Z2, which may be similar in nature to the impedance Z1 described in reference to FIGURE 3, and the current so coupled to the base of transistor 30 opposes any feedback due to potentials induced in winding 33 which might be coupled from the collector to the base of transistor 30 via interelectrode capacitance 32. Thus, in the absence of input pulses, regularly occurring output pulses occur at terminal 37 in coincidence with negative-going excursions of the power pulse source 38, and these negative-going power pulses in turn produce the neuturalization current which is required for circuit operation in the absence of input pulses.

When an input pulse is in fact applied to terminals 31, transistor 30 is charged and, upon occurrence of a negative-going excursion of power pulse source 38, current is drawn from the transistor 30 via rectifier D3 and thence via transformer winding 33 to ground. At this same time current is drawn from the clamp circuit +V—R2—D4, via winding 35 and rectifier D5 to power pulse source 38; and it will be noted that the windings 33 and 35 are wound of opposite polarity to one another. Since, during this interval of time, the impedance of transistor 30 is very low, the flux generated by winding 33 tends to off-set the flux produced by winding 35. As a result, there is substantially no resultant flux change in the core of transformer T2 whereby no output pulse appears at terminal 37; and in addition, this lack of appreciable flux change in the core of transformer T2 prevents the induction of voltage in winding 34 whereby no neutralizing current is fed back to the base of transistor 30 via impedance Z2. Thus, when an input pulse is in fact supplied to the circuit, neutralizing current is suppressed, while in the alternative, absence of an input pulse causes the circuit to produce the required neutralizing current.

By reason of this selective neutralizing current operation wherein neutralizing current pulses are derived from the circuit output and fed back to the circuit input in a negative feedback fashion, as described in reference to FIGURE 4, the overall gain of the circuit is in fact greater than the gain of the circuit previously described in reference to FIGURE 3. This may be seen from the following: If the input power to the transistor base is denoted by $P_I$, the output power of the overall circuit by $P_O$, and the power required to neutralize the collector-to-base capacitance by $P_N$, then the total gain G3 of the circuit of FIGURE 3 is given by:

$$G3=\frac{P_O}{P_I+P_N}$$

and the gain G4, of the circuit of FIGURE 4, is given by:

$$G4=\frac{P_O-P_N}{P_I}$$

The ratio of the two gains may be written:

$$\frac{G4}{G3}=1+\left[\frac{P_N}{P_I}\left(1-\frac{P_I+P_N}{P_O}\right)\right]$$

The term in the brackets will be positive in practical cases since the output power must be greater than the input plus neutralizing powers to have a useful circuit that can drive other stages. The ratio is therefore greater than unity.

While I have described preferred embodiments of the present invention, many variations will be suggested to those skilled in the art and the foregoing description is therefore meant to be illustrative only and should not be considered limitative of the present invention. All such modifications as are in accord with the principles described are meant to fall within the scope of the appended claims.

Having thus described my invention, I claim:

1. In a control circuit, a transistor having an input electrode and an output electrode, a load, means including a source of spaced regularly occurring power pulses for effectively coupling said load to said output electrode only during predetermined spaced time intervals, a source of selectively occurring input signals coupled to said input electrode for controlling the conductivity of said transistor, and a current source coupled to said input electrode and operable to supply current to said input electrode during said predetermined spaced time intervals in prevention of a change in potential at said input electrode during power pulse feedback via the interelectrode capacitance between said output and input electrodes in the absence of said input signals.

2. The circuit of claim 1 wherein said current source comprises a clamp circuit for maintaining said input electrode at a predetermined potential in the absence of said input signals.

3. The circuit of claim 1 wherein said current source is of the pulse type, whereby said current source produces current to said input electrode only during said predetermined spaced time intervals.

4. The circuit of claim 3 including means responsive to the output signal state of said transistor for producing current from said current source to said input electrode only in the absence of said input signals.

5. The circuit of claim 1 wherein said input electrode comprises the base of said transistor, said output electrode comprising the collector of said transistor, the emitter of said transistor being grounded.

6. In an amplifier, a transistor having first, second, and third electrodes, means for applying control signals to said first electrode, said second electrode being grounded, a load, means effectively coupling said load to said third electrode during spaced time intervals subsequent to possible occurrance of said control signals, and circuit means including a source of current coupled to said first electrode and operative in response to absence of a control signal for producing a current flow to said first electrode for preventing the transfer of signals from said third to said first electrode via the interelectrode capacitance between said third and first electrodes.

7. The combination of claim 6 wherein said coupling means comprises a transformer having one winding connected to said third electrode and having a second winding connected to said load, and a source of regularly spaced pulses coupled to said transformer.

8. The combination of claim 7 wherein said source of current comprises a third winding on said transformer.

9. The combination of claim 6 wherein said coupling means comprises a source of power pulses exhibiting spaced potential excursions of a first polarity interposed by spaced potential excursions of a second polarity, and said source of current produces spaced current pulses in coincidence with power pulse excursions of a preselected polarity.

10. The combination of claim 6 wherein said first electrode comprises the base of said transistor, said second electrode comprises the emitter of said transistor, and said third electrode comprises the collector of said transistor.

11. A transistor amplifier comprising a transistor having an input terminal and an output terminal, means coupled to said output terminal for producing a transient signal thereat, means for selectively applying input signals to said input terminal tending to produce a conducting state in said transistor, a current source coupled to said input terminal, means for energizing said current source to supply a current to said input terminal of magnitude at least equal to the current drawn by the interelectrode capacitance between said input and said output terminals during the period of said transient signal when said transistor is in a non-conducting state, thereby to maintain said transistor in a non-conducting state.

12. A transistor amplifier comprising a transistor having an input electrode and an output electrode, a transformer having a first winding connected to said output electrode, a diode interposed between and in circuit with said first winding and said output electrode, an output circuit including a second winding on said transformer, a source of power pulses, a third winding connected to said source, an impedance, a fourth winding connected through said impedance to the input of said transistor, said third winding and said power pulses tending to cause a flux change in one direction in said transformer, said first winding and the forward current in said diode tending to cause a flux in the opposite direction when an input to said transistor is present, and said fourth winding providing a current through said impedance and said interelectrode capacitance as a result of said power pulses when an input to said transistor is not present to inhibit spurious outputs due to the interelectrode capacitance between said input and output electrodes.

13. A transistor amplifier comprising a transistor having input terminals and output terminals, said input terminals consisting of a first and second electrode of said transistor and said output terminals consisting of said second electrode and a third electrode, a transformer having a first winding connected to said third electrode, a diode interposed between and in circuit with said first winding and said third electrode, an output circuit including a second winding on said transformer, a source of power pulses, a third winding connected to said source, an impedance, a fourth winding connected through said impedance to said first electrode, input pulses supplied to said input terminals in conjunction with said power pulses, said third winding tending to cause a flux change in one direction in said transformer in response to said power pulses, and said first winding tending to cause a flux in the opposite direction in response to forward current in said diode during occurrence of an input pulse, whereby the output circuit connected to said second winding is substantiall not energized in response to an input pulse, and in the absence of an input pulse said source of power pulses causes energization of said fourth winding to supply the current passed by the interelectrode capacitance between said first and said third electrode.

14. In an amplifier, a transistor having an input terminal and an output terminal, means for selectively applying a signal to said input terminal during a first time interval tending to bias said transistor to conduction, a load in circuit with said output terminal, means for regularly applying power pulses to said output terminal tending to render said transistor conductive during a second time interval having its initial portion occurring during said first time interval, and means including a source of current coupled to said input terminal and operable to produce a current for inhibiting the feedback of power pulses via the interelectrode capacitance between said output terminal and sid input terminal at least during those of said second time intervals initiated during the said first time intervals in which there is an absence of said signal.

15. A transistor amplifier comprising a transistor having an input electrode and an output electrode, means for supplying signals to said input electrode a transformer having a first winding connected to said output electrode, a diode interposed between and in circuit with said first winding and said output electrode, an output circuit including a second winding on said transformer, a source of power pulses, a third winding connected to said source, a fourth winding connected to the input of said transistor, said third winding and said power pulse source being connected to tend to cause a flux change in one direction in said transformer, said first winding and said diode being connected so that the forward current in said diode tends to cause a flux in the opposite direction when an input signal is applied to said transistor, and said fourth winding is connected to provide a current to the circuit of said input electrode induced by said power pulses when an input to said transistor is not present to inhibit spurious outputs due to the interelectrode capacitance between said input and output electrodes.

References Cited in the file of this patent

UNITED STATES PATENTS

| | | |
|---|---|---|
| 2,629,833 | Trent | Feb. 24, 1953 |
| 2,644,892 | Gehman | July 7, 1953 |
| 2,780,767 | Janssen | Feb. 5, 1957 |
| 2,802,118 | Simkins | Aug. 6, 1957 |
| 2,862,113 | Kabell | Nov. 25, 1958 |

OTHER REFERENCES

Article entitled "Internal Feedback and Neutralization of Transistor Amplifiers" Proc. of the I.R.E., July 1955, pp.838–847.

Publication entitled "Handbook of Semiconductor Electronics" by Hunter, pub. by McGraw-Hill, 1956, chap., 15, p. 28.